(12) United States Patent
Kagawa

(10) Patent No.: US 9,907,218 B2
(45) Date of Patent: Feb. 27, 2018

(54) NEAR-FIELD NOISE SUPPRESSION FILM

(71) Applicant: Seiji Kagawa, Koshigaya (JP)

(72) Inventor: Seiji Kagawa, Koshigaya (JP)

(*) Notice: Subject to any disclaimer, the term of this patent is extended or adjusted under 35 U.S.C. 154(b) by 120 days.

(21) Appl. No.: 14/631,522

(22) Filed: Feb. 25, 2015

(65) Prior Publication Data

US 2015/0173257 A1   Jun. 18, 2015

Related U.S. Application Data

(62) Division of application No. 14/129,839, filed as application No. PCT/JP2012/066417 on Jun. 27, 2012, now abandoned.

(30) Foreign Application Priority Data

Jun. 30, 2011   (JP) ................................ 2011-146344

(51) Int. Cl.
| | |
|---|---|
| C23C 14/58 | (2006.01) |
| H05K 9/00 | (2006.01) |
| H01Q 17/00 | (2006.01) |
| C23C 14/20 | (2006.01) |
| H02K 9/00 | (2006.01) |

(52) U.S. Cl.
CPC ........... H05K 9/0084 (2013.01); C23C 14/20 (2013.01); C23C 14/5806 (2013.01); H01Q 17/00 (2013.01); *Y10T 428/31681* (2015.04)

(58) Field of Classification Search
CPC ..... H05K 9/0081–9/0086; C23C 14/20; C23C 14/5806; C23C 16/56
USPC ........................................................ 427/96.3
See application file for complete search history.

(56) References Cited

U.S. PATENT DOCUMENTS

| | | | |
|---|---|---|---|
| 4,015,049 A | 3/1977 | Yoda et al. | |
| 5,043,195 A * | 8/1991 | Skrivseth | H01L 23/60 206/524.6 |
| 5,656,335 A | 8/1997 | Schwing et al. | |
| 2002/0117315 A1* | 8/2002 | Gabower | B29C 51/10 174/377 |
| 2005/0243306 A1* | 11/2005 | Lasagni | G01B 11/0691 356/72 |
| 2010/0296166 A1 | 11/2010 | Hayashi et al. | |
| 2011/0031008 A1 | 2/2011 | Kagawa | |

FOREIGN PATENT DOCUMENTS

| | | | |
|---|---|---|---|
| JP | 5-226873 | A | 9/1993 |
| JP | 05226873 | A * | 9/1993 |
| JP | 8-59867 | A | 3/1996 |
| JP | 2000-6299 | A | 1/2000 |
| JP | 2000-357893 | A | 12/2000 |
| JP | 2001-135516 | A | 5/2001 |
| JP | 2002-94281 | A | 3/2002 |
| JP | 2006-278433 | A | 10/2006 |
| JP | 2006-279912 | A | 10/2006 |
| JP | 2006-295101 | A | 10/2006 |
| JP | 2008-53383 | A | 3/2008 |
| JP | 2010-153542 | A | 7/2010 |

OTHER PUBLICATIONS

Machine translation of JP05226873A.*
Pinnel, Tompkins, and Heath. Oxidation of nickel and nickel-gold alloys in air at 50° C.-150° C. Journal of the Electrochemical Society: Solid State Science and Technology (1979).*
International Search Report issued in PCT/JP2012/066417 dated Oct. 9, 2012.
Machine translation of JP 05-226873-A, 1993, from AIPN.
Written Opinion of the International Searching Authority issued in PCT/JP2012/066417 dated Oct. 9, 2012.

* cited by examiner

*Primary Examiner* — Dah-Wei D. Yuan
*Assistant Examiner* — Jose Hernandez-Diaz
(74) *Attorney, Agent, or Firm* — Birch, Stewart, Kolasch & Birch, LLP

(57) ABSTRACT

A noise suppression film having reduced unevenness of electromagnetic wave noise absorbability, which comprises a thin Ni film, which is vapor-deposited on one surface of a stretched plastic film of polyethylene terephthalate, and then subject to a heat-shrinkage-causable heat treatment at a temperature in a range of 110-170° C. for 10 minutes to 1 hour, (a) the light transmittance of the thin Ni film measured with laser rays having a wavelength of 660 nm being 3-50%, and (b) the surface resistance of the thin Ni film being 10-200 Ω/square when measured on its square test piece TP of 10 cm×10 cm under a load of 3.85 kg applied via a flat pressure plate, with a pair of electrodes each having a length completely covering a side of the test piece disposed on opposing side portions of the test piece.

6 Claims, 15 Drawing Sheets

NEAR-FIELD NOISE SUPPRESSION FILM

CROSS-REFERENCE TO RELATED APPLICATIONS

This application is a Divisional of co-pending application Ser. No. 14/129,839 filed on Dec. 27, 2013, which is a National Phase of PCT International Application No. PCT/JP2012/066417 filed on Jun. 27, 2012, which claims priority under 35 U.S.C. § 119(a) to Patent Application No. 2011-146344 filed in Japan on Jun. 30, 2011. All of the above applications are hereby expressly incorporated by reference into the present application.

FIELD OF THE INVENTION

The present invention relates to an inexpensive noise suppression film capable of absorbing near-field electromagnetic waves of several hundred MHz to several GHz in mobile information terminals such as mobile phones and smartphones, electronic appliances such as personal computers, etc.

BACKGROUND OF THE INVENTION

Recently, mobile communications terminals, electronic appliances, etc. having various functions and high performance have been getting required to be smaller and lighter, so that their electronic parts are arranged in a narrower space at higher density, with their speeds increasing. Accordingly, among circuits and parts, electromagnetic wave noises, particularly high-frequency noises of several hundred MHz to several GHz have become serious problems. To suppress such near-field electromagnetic wave noises, various noise suppression films have been proposed and put into practical use.

Many of such noise suppression films contain magnetic materials and/or conductive materials. For example, JP 2010-153542 A discloses an electromagnetic wave noise suppression film comprising a substrate, a conductive layer formed by a conductive coating material containing particles, flakes or thin wires of metals such as Cu, or carbon, and a magnetic layer formed by a magnetic coating material containing soft-magnetic materials such as ferrite, Sendust, Permalloy, etc. JP 2006-278433 A discloses a composite film for suppressing electromagnetic wave noises, which is obtained by laminating two or more calendered sheets each comprising soft-magnetic powder such as amorphous flakes having a composition of $Fe_{bal}$—$Cu_1$—$Si_{12.5}$—$Nb_3$—$Cr_1$—$B_{12}$ (atomic %), for example, and a resin, and further calendering the resultant laminate for integration. However, any of the noise suppression films disclosed in JP 2010-153542 A and JP 2006-278433 A does not have sufficient capability of absorbing near-field noises, is difficult to be made thinner because it contains magnetic materials and/or conductive materials blended in the resin, and suffers a high production cost.

JP 2006-279912 A discloses a sputtered thin film of AlO, CoAlO, CoSiO, etc., as a thin film for suppressing near-field electromagnetic wave noises generated in a quasi-microwave band, which has surface resistance controlled to 10-1000 Ω/square matching to the characteristic impedance Z (377Ω) of free space, to have a reflection coefficient ($S_{11}$) of −10 dB or less and a noise suppression effect ($\Delta P_{loss}/P_{in}$) of 0.5 or more. However, this thin film for suppressing near-field electromagnetic wave noises does not have sufficient electromagnetic wave absorbability.

JP 2008-53383 A discloses a radiowave-absorbing and shielding film having excellent heat dissipation characteristics, which comprises a graphite film having different thermal conductivities in plane and thickness directions, and a soft-magnetic layer formed on the graphite film, which contains soft-magnetic materials such as Fe, Co, FeSi, FeNi, FeCo, FeSiAl, FeCrSi, FeBSiC, etc., ferrite such as Mn—Zn ferrite, Ba—Fe ferrite, Ni—Zn ferrite, etc., or carbon particles. However, this radiowave-absorbing and shielding film does not have sufficient electromagnetic wave absorbability.

JP 05-226873 A discloses in Example 1 a radiowave absorber obtained by vapor-depositing nickel in a thickness of 12 nm on a 50-μm-thick polyimide film, heating it at 200° C. for 1 hour in air, and then laminating the heat-treated, nickel-vapor-deposited films via an adhesive. However, JP 05-226873 A is completely silent about the problems that (1) when a thin Ni film formed on a polyethylene terephthalate film by a vapor deposition method has surface resistance of several tens of Ω/square, it has excellent absorbability of near-field electromagnetic wave noises, but it is extremely difficult to form such a thin Ni film precisely, and actually formed thin Ni films have largely varying surface resistances, and that (2) the surface resistance of such thin Ni film is subject to large change with time, taking a long period of time until the surface resistance is completely stabilized, and the change with time of the surface resistance differs depending on ambient conditions (temperature, humidity, etc.) during that period.

Accordingly, JP 05-226873 A does not have a purpose of reducing the unevenness and change with time of electromagnetic wave absorbability, thereby stably having excellent electromagnetic wave absorbability. Therefore, heat treatment conditions in JP 05-226873 A are as wide as 50° C. to 400° C. and 30 minutes to 5 hours, 200° C. for 1 hour in Example 1. Further, JP 05-226873 A does not take into consideration the heat shrinkage of a thin Ni film by a heat treatment. Accordingly, JP 05-226873 A lists as substrates for the thin Ni film, plastic sheets such as polyimide, polyethylene terephthalate (PET), polyphenylene sulfide, polyvinyl chloride, etc., and metals such as brass, copper, iron, stainless steel, aluminum, etc., using a polyimide film, which is a heat-resistant resin free from heat shrinkage at heat treatment temperatures, in Example 1.

JP 2006-295101 A discloses a noise-suppressing member comprising a support and a thin nickel film formed on the support, the thin nickel film having an average thickness of 2-100 nm, which meets the condition of 0.5≤log R1−log R0≤3, wherein R1 represents volume resistivity (Ω·cm) converted from the measured value of surface resistance, and R0 represents the volume resistivity (Ω·cm) of nickel. Nickel forms fine clusters in the thin film. However, JP 2006-295101 A is completely silent about a heat treatment.

JP 08-59867 A discloses a transparent conductive film comprising a transparent conductive layer made of metals and/or metal oxides such as gold, silver, copper, indium oxides, tin oxides, indium oxide/tin oxide mixtures, etc. formed on at least one surface of a transparent polymer film substrate. JP 08-59867 A describes that after the transparent conductive layer is formed, an annealing treatment is preferably conducted at a temperature of about 120° C. to 200° C. for about 1-30 minutes. However, the transparent conductive layer heat-treated in JP 08-59867 A is not an electromagnetic-wave-absorbing layer, and the transparent conductive layer shown in Example is only ITO (metal oxide).

OBJECT OF THE INVENTION

Accordingly, an object of the present invention is to provide an inexpensive noise suppression film stably having high absorbability of electromagnetic wave noises of several hundred MHz to several GHz, which is suitable for mobile communications terminals, electronic appliances, etc.

DISCLOSURE OF THE INVENTION

As a result of intensive research to obtain a noise suppression film having high absorbability of electromagnetic wave noises of several hundred MHz to several GHz by vapor-deposing Ni on a plastic film, the following has been found.
(1) When a thin Ni film formed on a plastic film by a vapor deposition method has surface resistance of several tens of Ω/square, it has excellent absorbability of near-field electromagnetic wave noises, but it is extremely difficult to form such thin Ni films precisely, and actually formed thin Ni films have largely varying surface resistances.
(2) The surface resistance of such thin Ni films is subject to large change with time, so that it takes long until stabilized completely, and that the change with time of surface resistance differs depending on ambient conditions (temperature, humidity, etc.) during that period.

As a result of intensive research to solve the above problems, the inventor has found that although a stretched plastic film of polyethylene terephthalate is extremely poorer than a metal in heat resistance, likely subject to large heat shrinkage by heating, the heat treatment of a thin Ni film vapor-deposited on a plastic film at a temperature in a range of 110-170° C. for 10 minutes to 1 hour provides the thin Ni film with improved electromagnetic wave absorbability with its unevenness and change with time reduced, thereby providing a noise suppression film stably having excellent electromagnetic wave absorbability. The present invention has been completed based on such findings.

Thus, the noise suppression film of the present invention having reduced unevenness of electromagnetic wave noise absorbability comprises a thin Ni film, which is vapor-deposited on one surface of a stretched plastic film of polyethylene terephthalate, and then heat-treated at a temperature in a range of 110-170° C. for 10 minutes to 1 hour, (a) the light transmittance of the thin Ni film measured with laser rays having a wavelength of 660 nm being 3-50%, and (b) the surface resistance of the thin Ni film being 10-200 Ω/square when measured on its square test piece of 10 cm×10 cm under a load of 3.85 kg applied via a flat pressure plate, with a pair of electrodes each having a length completely covering a side of the test piece disposed on opposing side portions of the test piece.

The heat treatment temperature of the thin Ni film is preferably 130-160° C.

The heat treatment time of the thin Ni film is preferably 20-40 minutes.

A protective film is preferably laminated on the thin Ni film.

DESCRIPTION OF THE PREFERRED EMBODIMENTS

The embodiments of the present invention will be explained referring to the attached drawings, and it should be noted that explanation concerning one embodiment is applicable to other embodiments unless otherwise mentioned. Also, the following explanation is not restrictive, and various modifications may be made within the scope of the present invention.

[1] Noise Suppression Film

Figure 1:
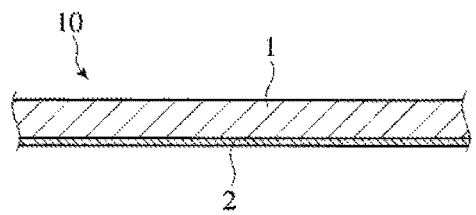
FIG. 1 is a cross-sectional view showing the noise suppression film of the present invention.

As shown in FIG. 1, the noise suppression film of the present invention 10 comprises a thin Ni film 2 formed on one surface of a stretched plastic film 1 of polyethylene terephthalate and then heat-treated.

(1) Plastic Film

The stretched plastic film 1 of polyethylene terephthalate has sufficient insulation, heat resistance and strength. The thickness of the plastic film 10 may be about 10-100 μm, preferably 10-30 μm.

(2) Thin Ni Film

The thin Ni film 2 can be formed by a known method such as a sputtering method, a vapor deposition method, etc.

(a) Light Transmittance of Thin Ni Film

Figure 2:
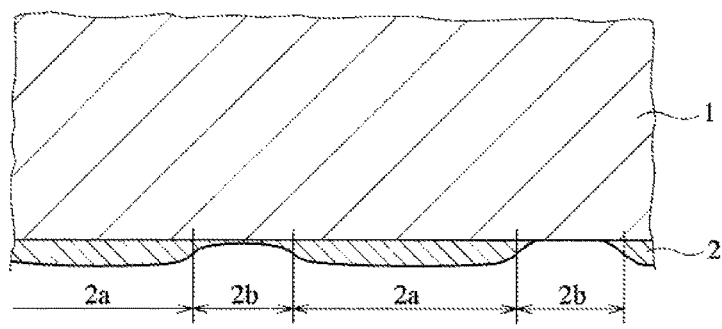
FIG. 2 is a partial cross-sectional view showing the details of a thin Ni film in the noise suppression film of the present invention.

Because the thin Ni film 2 is extremely thin, its thickness is uneven as shown in FIG. 2, having thick regions 2a and thin or Ni-free regions 2b. Accordingly, it is difficult to measure the thickness of the thin Ni film 2 accurately. Thus, the thickness of the thin Ni film 2 is expressed by the transmittance of a laser ray having a wavelength of 660 nm (simply called "light transmittance") in the present invention. The light transmittance is determined by averaging values measured at pluralities of arbitrary points of the thin Ni film 2. When measured at 5 or more points, the average values of light transmittance are stabilized. Because the plastic film 1 as thin as 30 μm or less has light transmittance of almost 100%, the light transmittance of the noise suppression film 10 is equal to that of the thin Ni film 2. However, when the plastic film 1 is thicker than that, the light transmittance of the thin Ni film 2 is obtained by subtracting the light transmittance of the plastic film 1 from the light transmittance of the noise suppression film 10.

The light transmittance of the thin Ni film 2 should be in a range of 3-50%. When the light transmittance is less than 3%, the thin Ni film 2 is too thick, functioning like a metal foil, resulting in high reflectance of electromagnetic waves and low absorbability of electromagnetic wave noises. On the other hand, when the light transmittance is more than 50%, the thin Ni film 2 is too thin, resulting in insufficient electromagnetic wave absorbability. The light transmittance of the thin Ni film 2 is preferably 5-45%, more preferably 8-30%.

(b) Surface Resistance

It has been found that the surface resistance of a thin Ni film 2 having light transmittance of 3-50% largely varies depending on measurement methods. To have as large a contact area as possible between the thin Ni film 2 and an electrode with close and uniform contact therebetween, the surface resistance is measured by a DC two-terminal method under pressure (simply called "under-pressure two-terminal method"), using an apparatus shown in FIG. 3. Specifically, a square test piece TP1 (10 cm×10 cm) of the noise suppression film 10 is placed with its thin Ni film 2 above on a flat, hard insulation surface, a pair of electrodes 11, 11 each comprising an electrode body 11a of 10 cm in length, 1 cm in width and 0.5 mm in thickness, and an electrode extension 11b of 1 cm in width and 0.5 mm in thickness extending from a center side of the electrode body 11a is attached to opposing side portions of the square test piece TP1, a transparent acrylic plate 12 of 10 cm×10 cm×5 mm is placed on the test piece TP1 and both electrodes 11, 11, such that it completely covers them, and a cylindrical weight 13 (3.85 kg) of 10 cm in diameter is placed on the transparent acrylic plate 12, to measure current flowing between both electrode extensions 11b, 11b to determine the surface resistance.

The surface resistance of the heat-treated thin Ni film 2 should be in a range of 10-200 Ω/square. When the surface resistance is less than 10 Ω/square, the thin Ni film 2 is too thick, functioning like a metal foil, resulting in low absorbability of electromagnetic wave noises. On the other hand, when the surface resistance is more than 200 S2/square, the thin Ni film 2 is too thin to have sufficient electromagnetic wave absorbability. The surface resistance of the heat-treated thin Ni film 2 is preferably 15-150 Ω/square, more preferably 20-120 Ω/square, most preferably 30-100 Ω/square.

[2] Heat Treatment

The extremely thin Ni film 2 having light transmittance of 3-50% and surface resistance of 10-200 Ω/square is uneven in thickness as a whole as shown in FIG. 2, having relatively thick regions 2a and relatively thin or thin-film-free regions 2b. It is considered that the relatively thin regions 2b act as magnetic gaps and high-resistance regions, attenuating magnetic flux and current generated in the thin Ni film 2 by near-field noises. It has been found, however, that because the structure of such thin Ni film 2 largely differs depending on production conditions, it is extremely difficult to stably form a thin Ni film 2 having constant light transmittance and surface resistance. Intensive research has revealed that when a thin Ni film 2 formed by a vapor deposition method is heat-treated at a temperature of higher than 100° C., at which the heat shrinkage of a stretched polyethylene terephthalate film 1 is likely to occur, the surface resistance of the thin Ni film 2 is stabilized with slight decrease, and subject to substantially no change with time. The heat treatment of a stretched polyethylene terephthalate film at a heat-shrinkage-causable temperature exceeding 100° C. has not conventionally been contemplated at all. However, a heat treatment at a temperature in a range of 110-170° C. for a short period of time (10 minutes to 1 hour) stabilizes the surface resistance of the thin Ni film 2 with slight decrease, thereby stabilizing electromagnetic wave noise absorbability, though the polyethylene terephthalate film 1 is slightly heat-shrunk. The stabilization of electromagnetic wave noise absorbability means not only that the electromagnetic wave noise absorbability is subject to substantially no change with time, but also that there is reduced unevenness depending on production conditions and among production lots.

The surface resistance can be adjusted by changing heat treatment conditions. For example, when a thin Ni film 2 has high surface resistance, a higher heat treatment temperature or a longer heat treatment time reduces the surface resistance to a desired level. Oppositely, when the thin Ni film 2 has low surface resistance, a lower heat treatment temperature or a shorter heat treatment time suppresses decrease in the surface resistance.

It has been found that even among vapor-deposited films having the same surface resistance, there is large difference in electromagnetic wave absorbability between those free from a heat treatment and those heat-treated, and that vapor-deposited films adjusted to have desired surface resistance by a heat treatment have higher electromagnetic wave absorbability. The reasons therefor are not clear, because it is extremely difficult to evaluate the change of the state (particularly metal structure) of an extremely thin Ni film by a heat treatment. Because experiment has revealed that the electromagnetic wave absorbability of a thin Ni film changes with a heat treatment temperature, the structural condition of the thin Ni film in the present invention is defined by the heat treatment temperature.

The heat treatment temperature is in a range of 110-170° C. When the heat treatment temperature is lower than 110° C., the heat treatment has substantially no effect of improving the electromagnetic wave absorbability with reduced unevenness. On the other hand, when the heat treatment temperature is higher than 170° C., the thin Ni film 2 is surface-oxidized, and the polyethylene terephthalate film having no sufficient heat resistance shrinks too much. The heat treatment temperature is preferably 120-170° C., more preferably 130-160° C. The heat treatment time is generally 10 minutes to 1 hour, preferably 20-40 minutes, though variable depending on the heat treatment temperature.

A protective film is preferably laminated on the heat-treated thin Ni film 2, to protect the thin Ni film 2 with enough insulation. The protective film may be the same as the polyethylene terephthalate film 1.

[3] Absorbability of Near-Field Electromagnetic Wave Noise (1) Transmission Attenuation Ratio Using a system comprising a microstripline MSL (64.4 mm×4.4 mm) of 50Ω, an insulation substrate 20 supporting the microstripline MSL, a grounded electrode 21 attached to a lower surface of the insulation substrate 20, conductor pins 22, 22 connected to both edges of the microstripline MSL, a network analyzer NA, and coaxial cables 23, 23 for connecting the network analyzer NA to the conductor pins 22, 22 as shown in FIGS. 4(*a*) and 4(*b*), with a test piece TP2 of the noise suppression film attached to the microstripline MSL by an adhesive, reflected wave power $S_{11}$ and transmitted wave power $S_{12}$ are measured with incident waves of 0.1-6 GHz, to determine the transmission attenuation ratio Rtp by the following formula (1):

$$Rtp = -10 \times \log [10^{S21/10}/(1-10^{S11/10})] \quad (1).$$

(2) Noise Absorption Ratio

The power loss $P_{loss}$ is determined by subtracting the reflected wave power $S_{11}$ and the transmitted wave power $S_{12}$ from the incident power input to the system shown in FIGS. 4(*a*) and 4(*b*), and the noise absorption ratio $P_{loss}/P_{in}$ is determined by dividing $P_{loss}$ by the incident power $P_{in}$.

The present invention will be explained in more detail referring to Examples below without intention of restricting the present invention thereto.

EXAMPLE 1 AND COMPARATIVE EXAMPLE 1

Figure 3A:
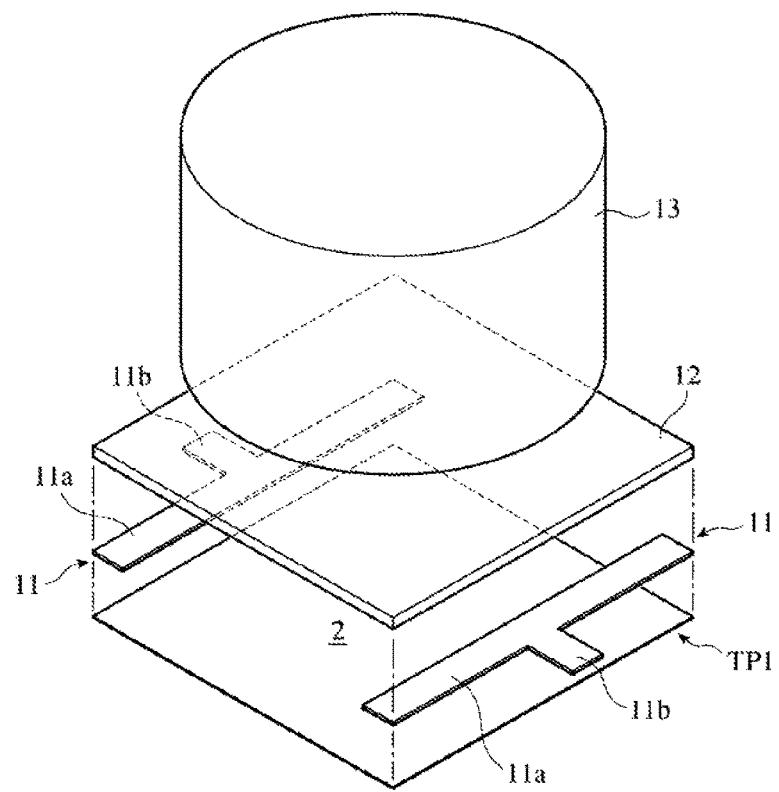
FIG. 3(a) is a perspective view showing an apparatus for measuring the surface resistance of the noise suppression film.
Figure 3B:
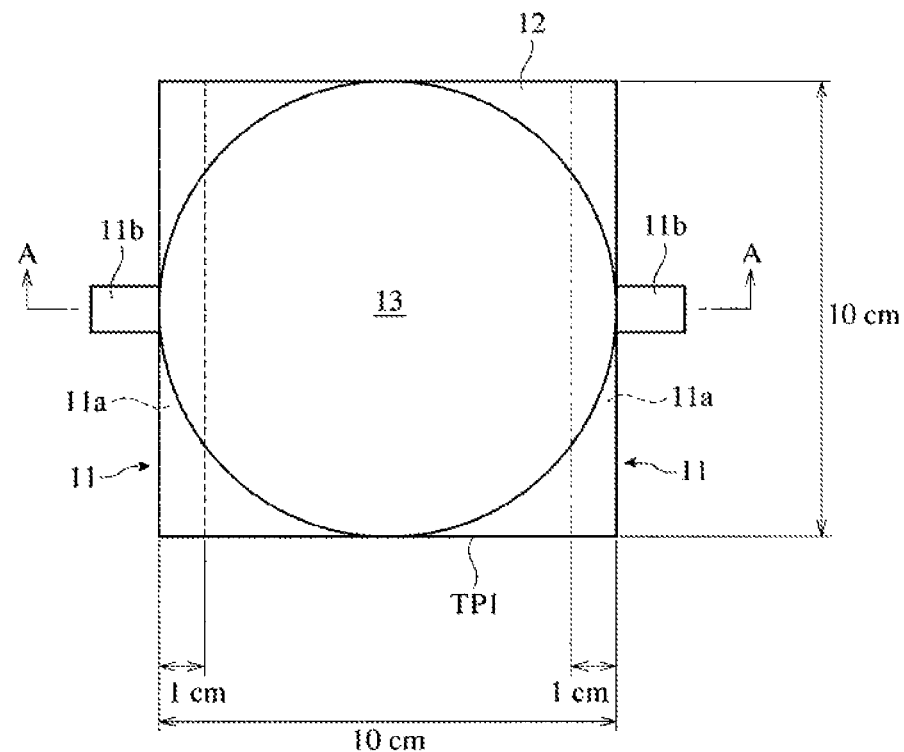
FIG. 3(b) is a plan view showing the measurement of the surface resistance of the noise suppression film using the apparatus shown in FIG. 3(a).
Figure 3C:
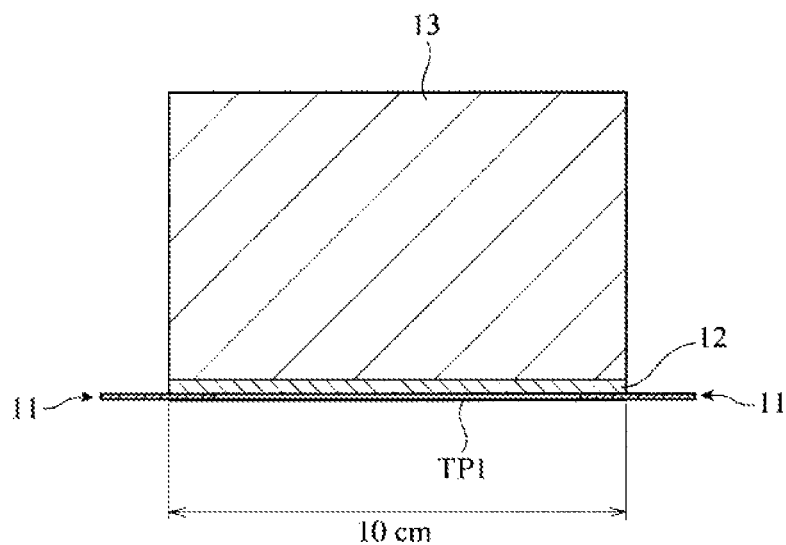
FIG. 3(c) is a cross-sectional view taken along the line A-A in FIG. 3(b).

A thin Ni film 2 having a light transmittance target of 9% at wavelength of 660 nm was formed on a 16-μm-thick polyethylene terephthalate (PET) film 1 by a vacuum vapor deposition method, to produce a long vapor-deposited film. Five test pieces TP1 of 10 cm×10 cm were cut out of arbitrary portions of the vapor-deposited film. The light transmittance of five arbitrary portions of each test piece TP1 was measured with laser rays having wavelength of 660 nm using a transmission-type laser sensor (IB-05) available from Keyence Corporation, and averaged. The surface resistance of each test piece TP1 was measured by the under-pressure two-terminal method as shown in FIG. 3. Each electrode 11 comprised an electrode body 11*a* of 10 cm in length, 1 cm in width and 0.5 mm in thickness and an electrode extension 11*b* of 1 cm in width and 0.5 mm in thickness, a transparent acrylic plate 12 was 10 cm×10 cm×5 mm, and a cylindrical weight 13 of 3.85 kg had a diameter of 10 cm. With both electrodes 11, 11 connected to a resistance meter (type: 3565) available from Tsuruga Electric Corporation, the surface resistance was determined from the measured current. Averaged on all test pieces TP1, the light transmittance was 9.1%, and the surface resistance was 43 Ω/square.

Figure 6:
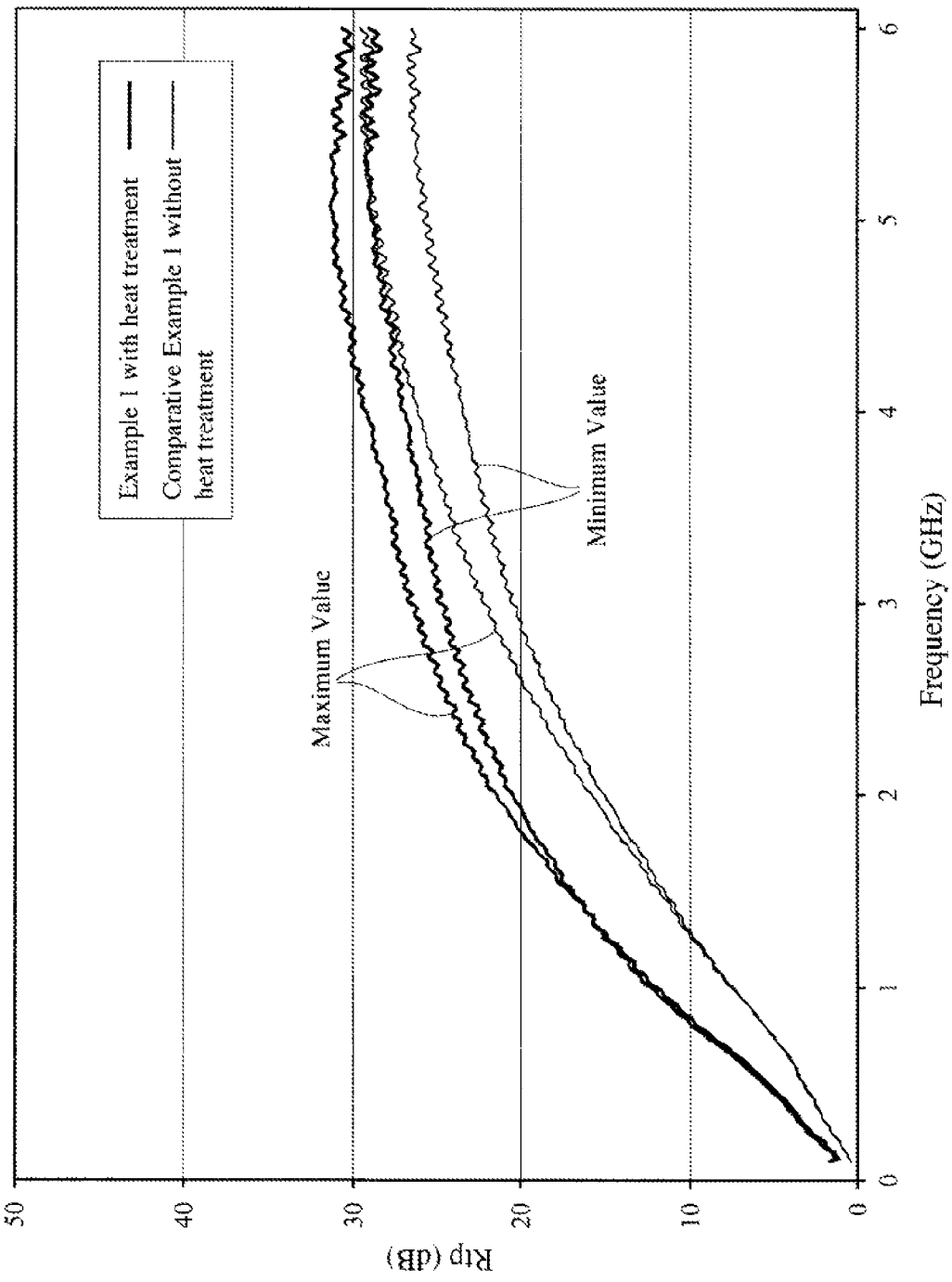
FIG. 6 is a graph showing the maximum and minimum values of Rtps of the vapor-deposited film samples of Example 1 and Comparative Example 1 in a range of 0.1-6 GHz.

With each of 20 test pieces TP2 (55.2 mm×4.7 mm) cut out of arbitrary portions of the long vapor-deposited film adhered to a microstripline MSL in the system shown in FIGS. 4(*a*) and 4(*b*), reflective wave power $S_{11}$ and transmitted wave power $S_{12}$ in a frequency range of 0.1-6 GHz were measured to determine a transmission attenuation ratio Rtp in a frequency range of 0.1-6 GHz by the above formula (1). The maximum and minimum values of transmission attenuation ratios Rtps of 20 test pieces TP2, which were not heat-treated, are shown as Comparative Example 1 in FIG. 6.

Figure 5A:
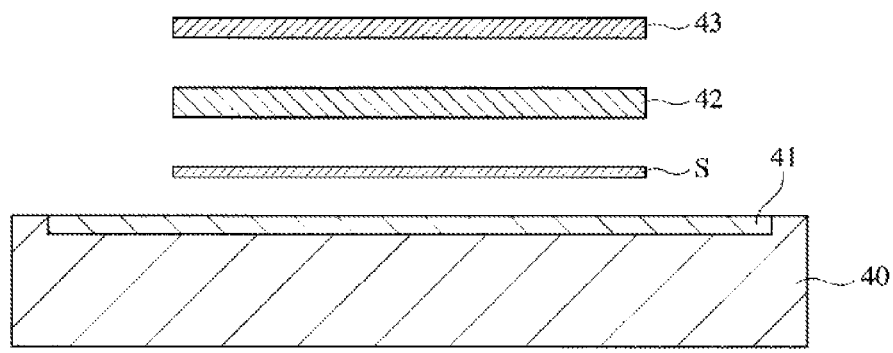
FIG. 5(a) is a cross-sectional view showing an apparatus for heat-treating a plastic film having a vapor-deposited thin Ni film.
Figure 5B:
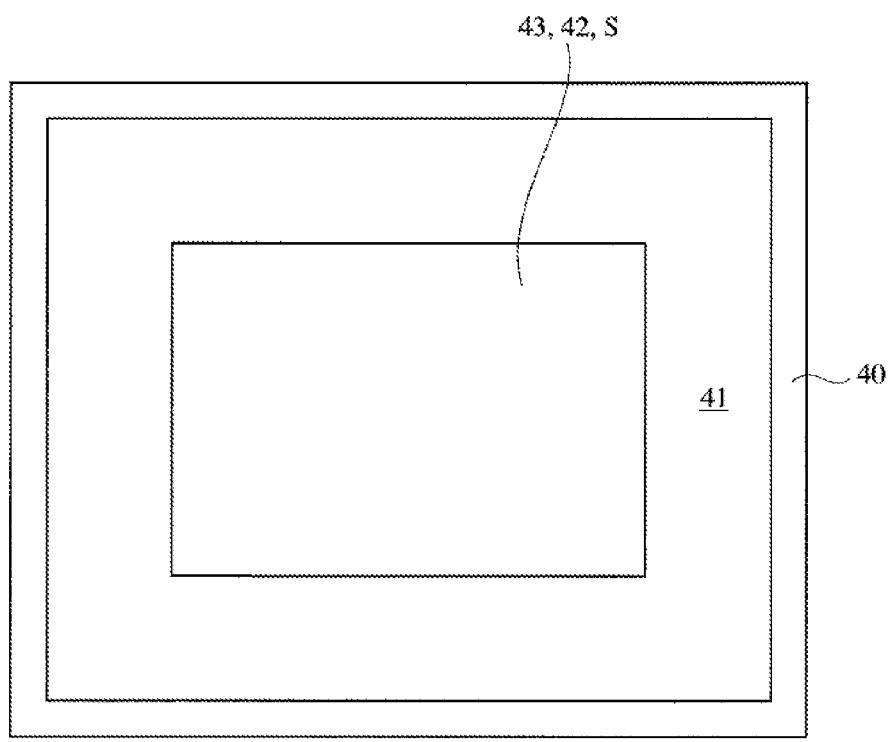
FIG. 5(b) is a plan view showing the heat treatment of a Ni-vapor-deposited film using the apparatus of FIG. 5(a).

Each of 20 samples S of an A4-size (210 mm×297 mm) cut out of arbitrary portions of the long vapor-deposited film was placed with its thin Ni film 2 below on a hot plate 41 in a heating apparatus 40 as shown in FIGS. 5(*a*) and 5(*b*), and an A4-size insulation sheet 42 of Teflon (registered trademark) of 3 mm in thickness and an A4-size iron plate 43 of 2 mm in thickness were placed thereon, to carry out a heat treatment at 150° C. for 30 minutes. Heat shrinkage caused by the heat treatment was about 1%.

Five test pieces TP1 of 10 cm×10 cm cut out of each heat-treated sample S were measured with respect to light transmittance and surface resistance by the same method as above. The heat-treated test pieces TP1 had average light transmittance of 8.9% and average surface resistance of 39 Ω/square. Further, each of test pieces TP2 (55.2 mm×4.7 mm) cut out of 20 heat-treated, vapor-deposited film samples S was measured with respect to reflective wave power $S_{11}$ and transmitted wave power $S_{12}$ in a frequency range of 0.1-6 GHz by the same method as above, to determine a transmission attenuation ratio Rtp in a frequency range of 0.1-6 GHz by the above formula (1). The maximum and minimum values of transmission attenuation ratios Rtps of 20 heat-treated test pieces TP2 are shown as Example 1 in FIG. 6.

Figure 7A:
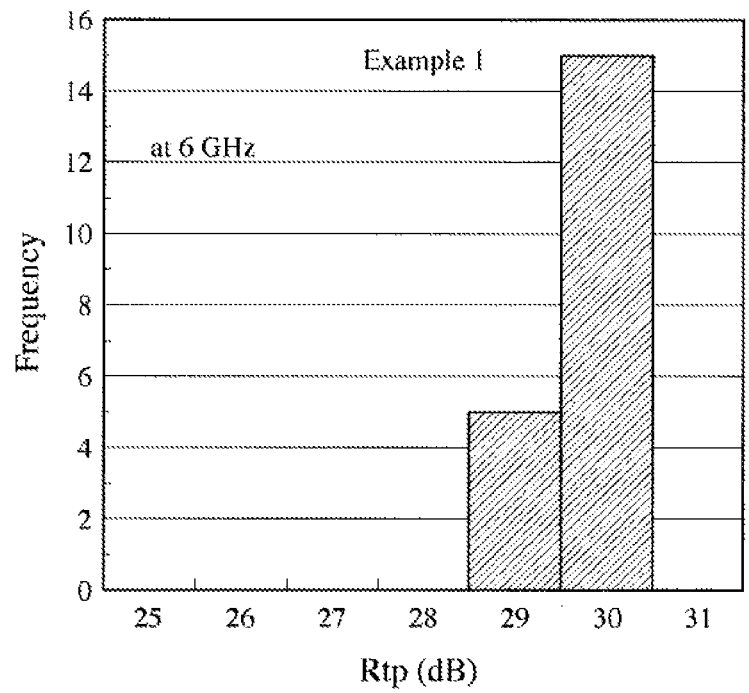
FIG. 7(a) is a graph showing the distribution of Rtps of the vapor-deposited film samples of Example 1 at 6 GHz.
Figure 7B:
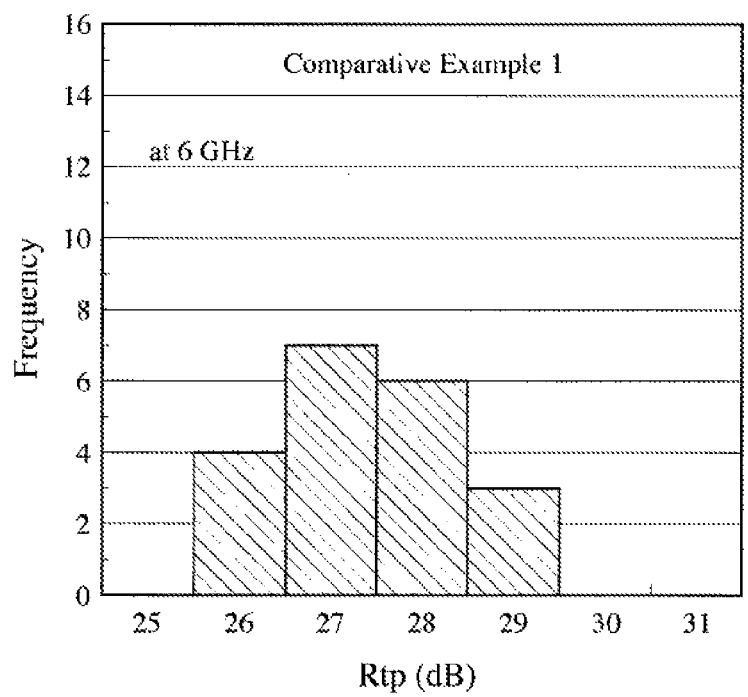
FIG. 7(b) is a graph showing the distribution of Rtps of the vapor-deposited film samples of Comparative Example 1 at 6 GHz.

The distributions of the transmission attenuation ratios Rtps at 6 GHz of 20 heat-treated test pieces TP2 of Example 1 and 20 test pieces TP2 (without heat treatment) of Comparative Example 1 are shown in FIGS. 7(*a*) and 7(*b*), respectively. For example, the frequency of Rtp of 30 dB is expressed by the number of test pieces having Rtp in a range of 30 dB≤Rtp<31 dB (the same is true below). As is clear from FIGS. 6 and 7, the test pieces of the heat-treated, vapor-deposited film in Example 1 had higher Rtps, with narrower distributions (smaller unevenness), than those of the vapor-deposited film without heat treatment in Comparative Example 1.

EXAMPLE 2 AND COMPARATIVE EXAMPLE 2

A long vapor-deposited film was produced in the same manner as in Example 1 except that the light transmittance target of the thin Ni film 2 at wavelength of 660 nm was 15%, and 5 test pieces TP1 cut out of arbitrary portions thereof were measured with respect to light transmittance and surface resistance by the same methods as in Example 1. The test pieces TP1 had average light transmittance of 15.5% and average surface resistance of 52 Ω/square.

Each of 20 test pieces TP2 (55.2 mm×4.7 mm) cut out of arbitrary portions of the long vapor-deposited film was measured with respect to reflective wave power $S_{11}$ and transmitted wave power $S_{12}$ in a frequency range of 0.1-6

Figure 8:
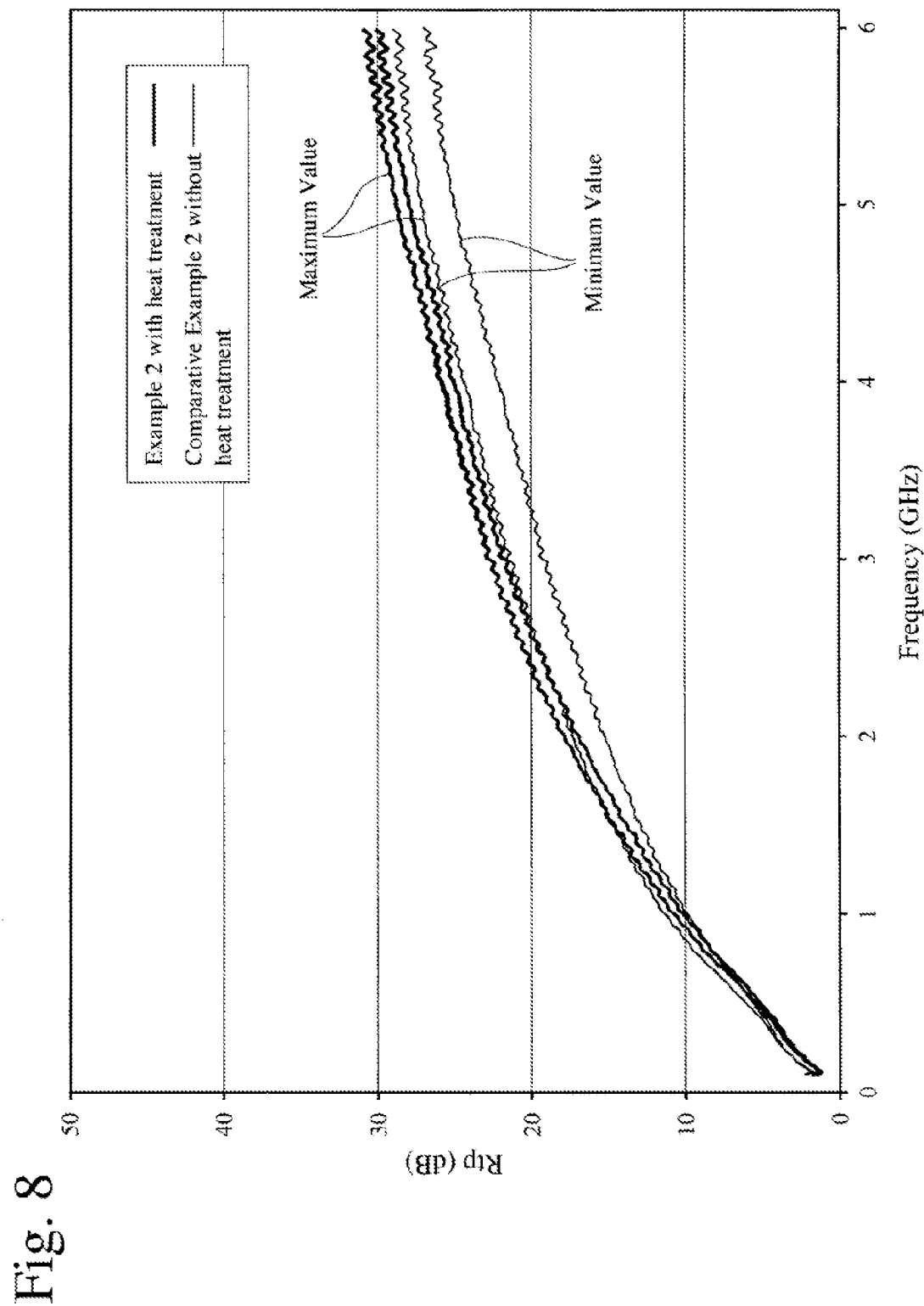
FIG. 8 is a graph showing the maximum and minimum values of Rtps of the vapor-deposited film samples of Example 2 and Comparative Example 2 in a range of 0.1-6 GHz.

GHz in the same manner as in Example 1, to determine a transmission attenuation ratio Rtp in a frequency range of 0.1-6 GHz by the above formula (1). The maximum and minimum values of transmission attenuation ratios Rtps of 20 test pieces TP2 without heat treatment are shown as Comparative Example 2 in FIG. 8.

20 samples S of an A4 size (210 mm×297 mm) cut out of arbitrary portions of the long vapor-deposited film were heat-treated at 150° C. for 30 minutes in the same manner as in Example 1. The heat treatment caused heat shrinkage of about 1%. Five test pieces TP1 of 10 cm×10 cm cut out of each heat-treated sample S were measured with respect to light transmittance and surface resistance in the same manner as in Example 1. The heat-treated test pieces TP1 had average light transmittance of 15.2% and average surface resistance of 48 Ω/square.

With respect to test pieces TP2 (55.2 mm×4.7 mm) cut out of 20 heat-treated, vapor-deposited film samples S, the transmission attenuation ratios Rtps in a frequency range of 0.1-6 GHz were determined by the same method as in Example 1. The maximum and minimum values of transmission attenuation ratios Rtps of 20 heat-treated test pieces TP2 are shown as Example 2 in FIG. 8.

Figure 9A:
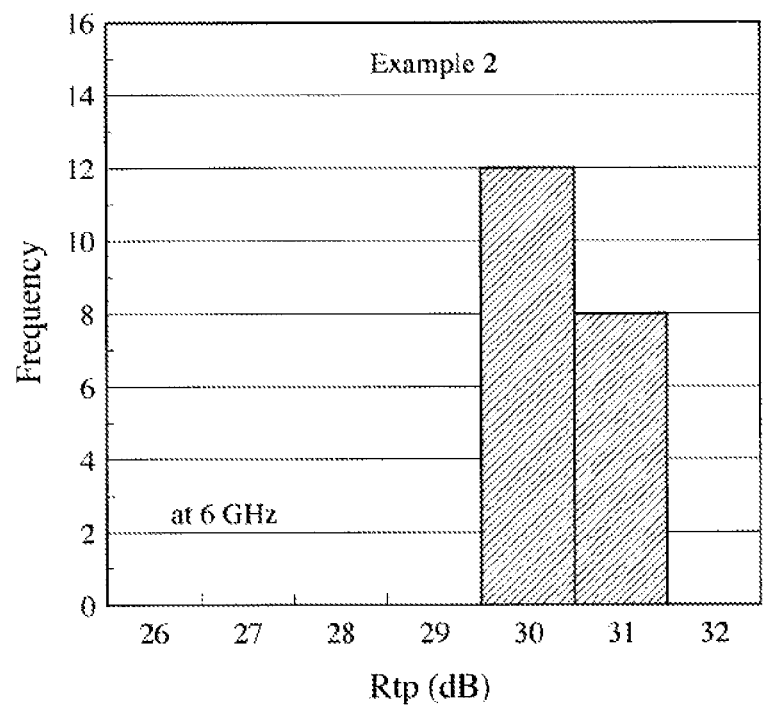
FIG. 9(a) is a graph showing the distribution of Rtps of the vapor-deposited film samples of Example 2 at 6 GHz.
Figure 9B:
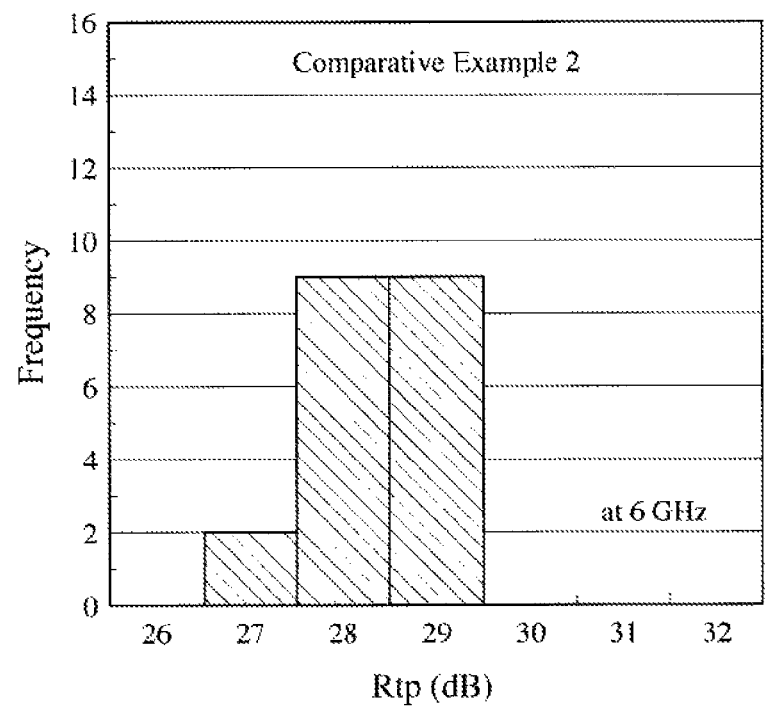
FIG. 9(b) is a graph showing the distribution of Rtps of the vapor-deposited film samples of Comparative Example 2 at 6 GHz.

The distributions of transmission attenuation ratios Rtps at 6 GHz of 20 heat-treated test pieces TP2 of Example 2 and 20 test pieces TP2 (without heat treatment) of Comparative Example 2 are shown in FIGS. 9(a) and 9(b), respectively. As is clear from FIGS. 8 and 9, the heat-treated, vapor-deposited film test pieces of Example 2 had higher Rtp, with narrower distributions (smaller unevenness), than those of the vapor-deposited film test pieces of Comparative Example 2 without heat treatment.

EXAMPLE 3 AND COMPARATIVE EXAMPLE 3

A long vapor-deposited film was produced in the same manner as in Example 1, except that the light transmittance target of the thin Ni film 2 at wavelength of 660 nm was 28%, and five test pieces TP1 cut out of arbitrary portions thereof were measured with respect to light transmittance and surface resistance by the same methods as in Example 1. The test pieces TP1 had average light transmittance of 27.0% and average surface resistance of 107 Ω/square.

Figure 10:
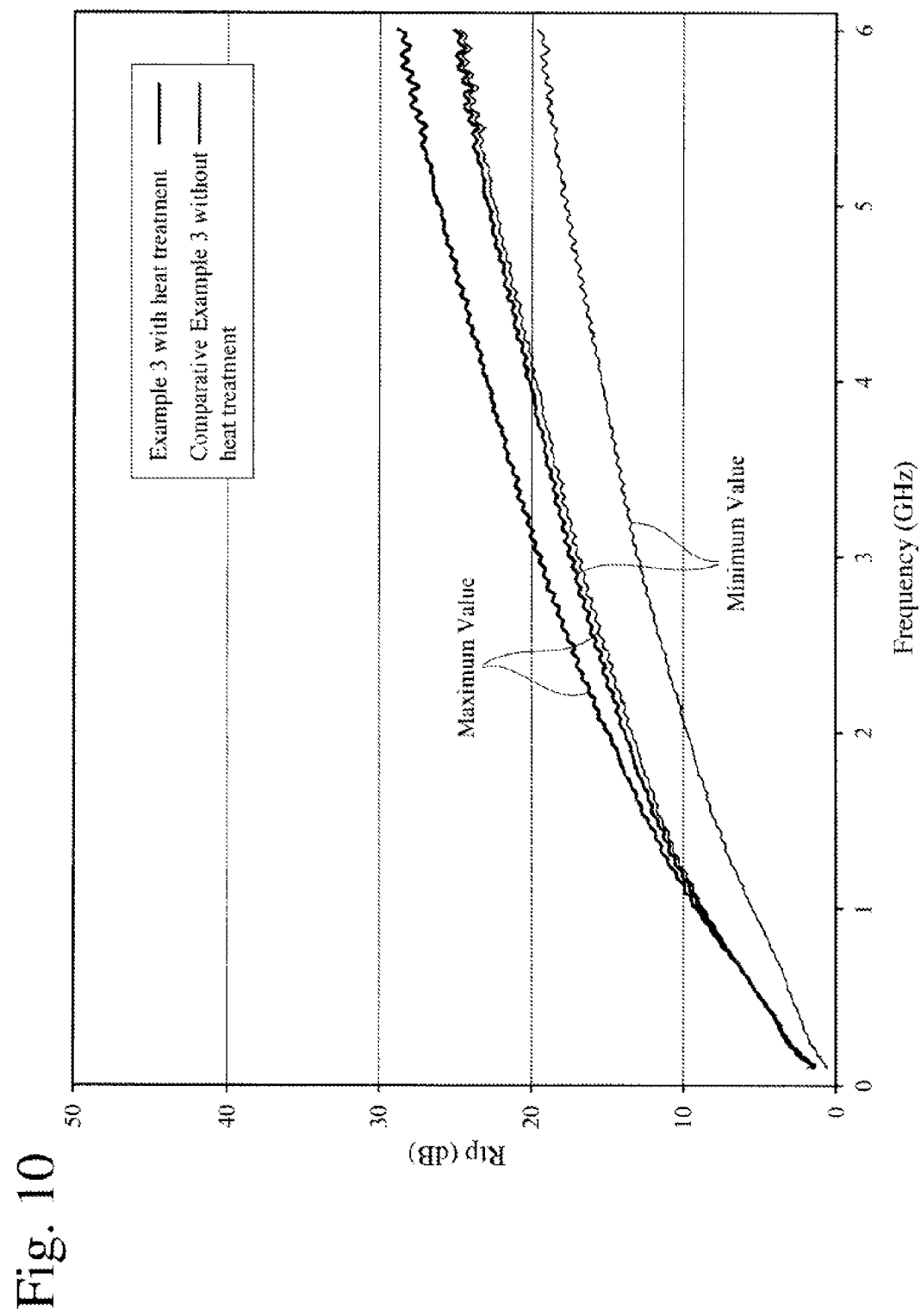
FIG. 10 is a graph showing the maximum and minimum values of Rtps of the vapor-deposited film samples of Example 3 and Comparative Example 3 in a range of 0.1-6 GHz.

With respect to each of 20 test pieces TP2 (55.2 mm×4.7 mm) cut out of arbitrary portions of the long vapor-deposited film, the reflective wave power $S_{11}$ and the transmitted wave power $S_{12}$ were measured in a frequency range of 0.1-6 GHz by the same method as in Example 1 to determine a transmission attenuation ratio Rtp in a frequency range of 0.1-6 GHz by the above formula (1). The maximum and minimum values of transmission attenuation ratios Rtps of 20 test pieces TP2 without heat treatment are shown as Comparative Example 3 in FIG. 10.

20 samples S of an A4 size (210 mm×297 mm) were cut out of arbitrary portions of the long vapor-deposited film, and heat-treated at 150° C. for 30 minutes by the same methods as in Example 1. The heat treatment caused heat shrinkage of about 1%. Five test pieces TP1 of 10 cm×10 cm cut out of each heat-treated sample S were measured with respect to light transmittance and surface resistance by the same methods as in Example 1. The heat-treated test pieces TP1 had average light transmittance of 26.5% and average surface resistance of 99 Ω/square.

With respect to test pieces TP2 (55.2 mm×4.7 mm) cut out of 20 heat-treated, vapor-deposited film samples S, the transmission attenuation ratios Rtps were determined in a frequency range of 0.1-6 GHz by the same method as in Example 1. The maximum and minimum values of transmission attenuation ratios Rtps of 20 heat-treated test pieces TP2 are shown as Example 3 in FIG. 10.

Figure 11A:
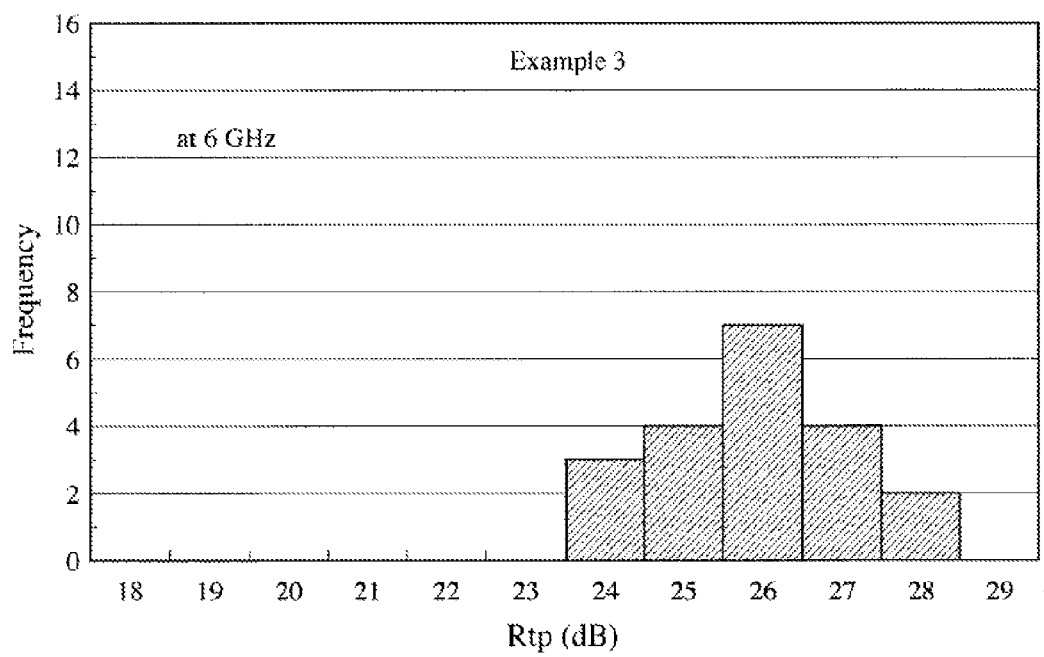
FIG. 11(a) is a graph showing the distribution of Rtps of the vapor-deposited film samples of Example 3 at 6 GHz.
Figure 11B:
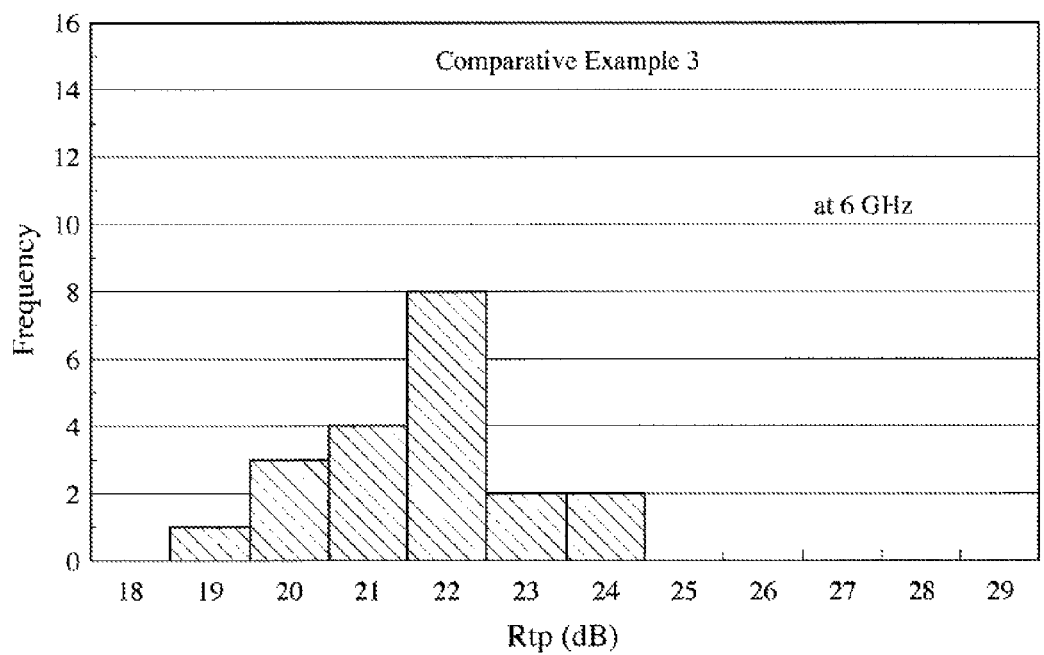
FIG. 11(b) is a graph showing the distribution of Rtps of the vapor-deposited film samples of Comparative Example 3 at 6 GHz.

The distributions of transmission attenuation ratios Rtps at 6 GHz of 20 heat-treated test pieces TP2 of Example 3 and 20 test pieces TP2 of Comparative Example 3 (without heat treatment) are shown in FIGS. 11(a) and 11(b), respectively. As is clear from FIGS. 10 and 11, the heat-treated, vapor-deposited film test pieces of Example 3 had higher Rtps, with narrower distributions (smaller unevenness), than those of the vapor-deposited film test pieces of Comparative Example 3 without heat treatment.

EXAMPLE 4 AND COMPARATIVE EXAMPLE 4

A long vapor-deposited film was produced in the same manner as in Example 1, except that the light transmittance target of the thin Ni film 2 at wavelength of 660 nm was 48%, and five test pieces TP1 cut out of arbitrary portions thereof were measured with respect to light transmittance and surface resistance by the same methods as in Example 1. The test pieces TP1 had average light transmittance of 47.5% and average surface resistance of 217 Ω/square.

Figure 12:
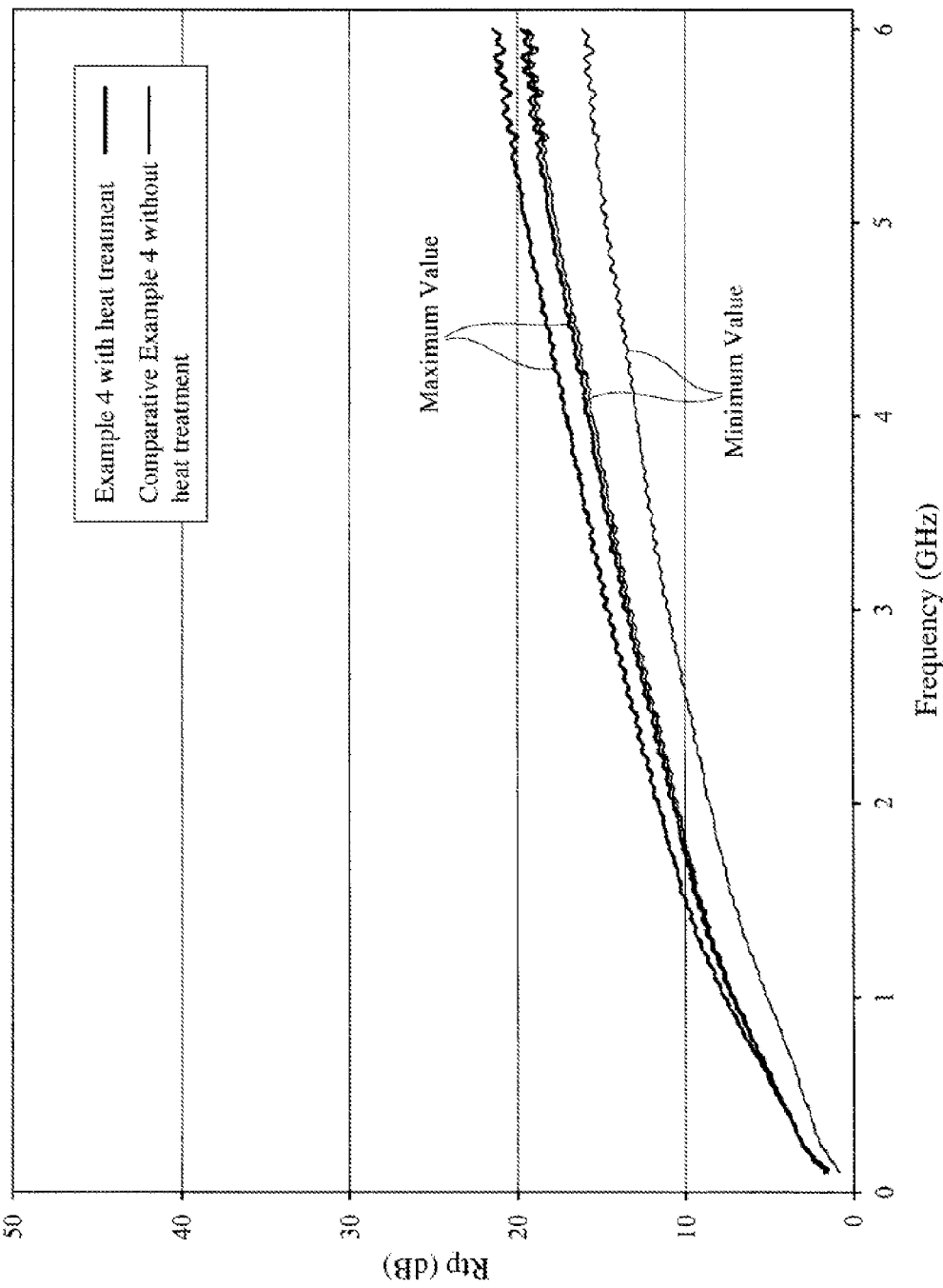
FIG. 12 is a graph showing the maximum and minimum values of Rtps of the vapor-deposited film samples of Example 4 and Comparative Example 4 in a range of 0.1-6 GHz.

With respect to 20 test pieces TP2 (55.2 mm×4.7 mm) cut out of arbitrary portions of the long vapor-deposited film, the reflective wave power $S_{11}$ and the transmitted wave power $S_{12}$ were measured in a frequency range of 0.1-6 GHz by the same method as in Example 1 to determine transmission attenuation ratios Rtps in a frequency range of 0.1-6 GHz by the above formula (1). The maximum and minimum values of transmission attenuation ratios Rtps of 20 test pieces TP2 without heat treatment are shown as Comparative Example 4 in FIG. 12.

20 samples S of an A4 size (210 mm×297 mm) were cut out of arbitrary portions of the long vapor-deposited film, and heat-treated at 150° C. for 30 minutes in the same manner as in Example 1. The heat treatment caused heat shrinkage of about 1%. Five test pieces TP1 of 10 cm×10 cm cut out of each heat-treated sample S were measured with respect to light transmittance and surface resistance by the same methods as in Example 1. The heat-treated test piece TP1 had average light transmittance of 46.5% and average surface resistance of 185 Ω/square.

With respect to test pieces TP2 (55.2 mm×4.7 mm) cut out of 20 heat-treated, vapor-deposited film samples S, the transmission attenuation ratios Rtps in a frequency range of 0.1-6 GHz were determined by the same method as in Example 1. The maximum and minimum values of transmission attenuation ratios Rtps of 20 heat-treated test pieces TP2 are shown as Example 4 in FIG. 12.

Figure 13A:
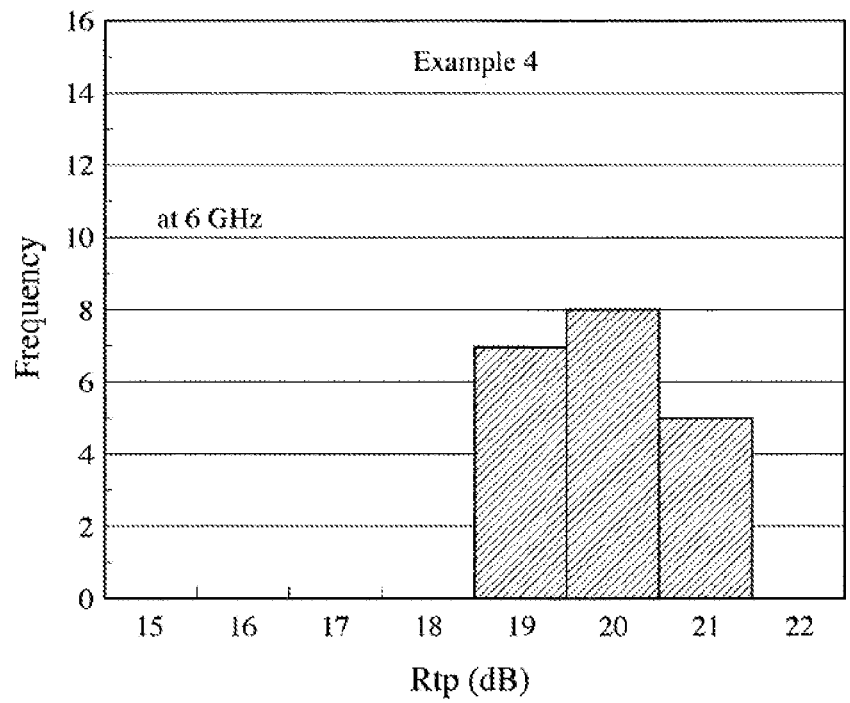
FIG. 13(a) is a graph showing the distribution of Rtps of the vapor-deposited film samples of Example 4 at 6 GHz.
Figure 13B:
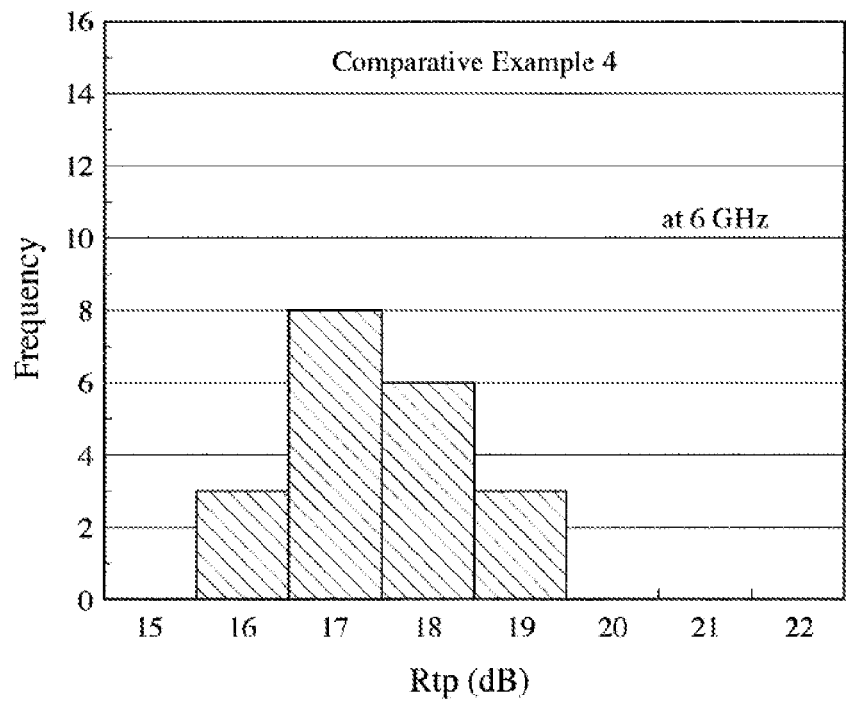
FIG. 13(b) is a graph showing the distribution of Rtps of the vapor-deposited film samples of Comparative Example 4 at 6 GHz.

The distributions of transmission attenuation ratios Rtps at 6 GHz of 20 heat-treated test pieces TP2 of Example 4 and 20 test pieces TP2 (without heat treatment) of Comparative Example 4 are shown in FIGS. 13(a) and 13(b), respectively. As is clear from FIGS. 12 and 13, the heat-treated, vapor-deposited film test pieces in Example 4 had higher Rtps, with narrower distributions (smaller unevenness), than those of the vapor-deposited film test pieces without heat treatment in Comparative Example 4.

Figure 4A:
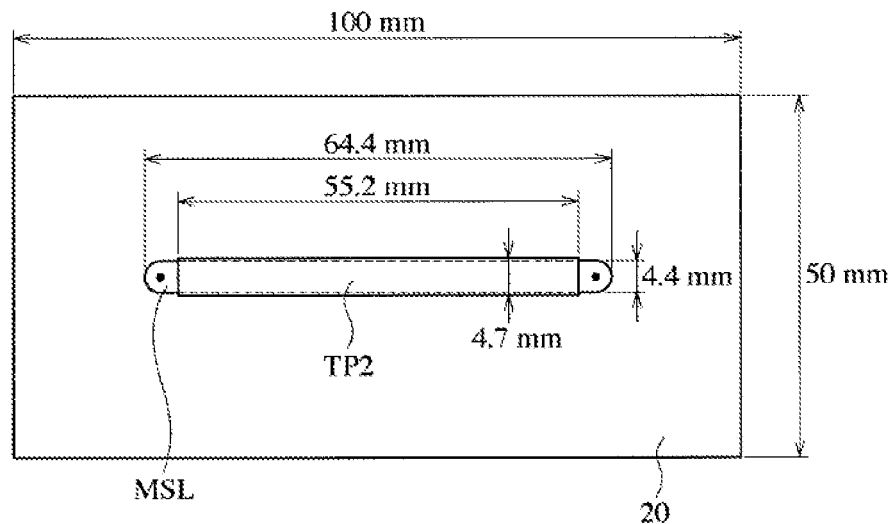
FIG. 4(a) is a plan view showing a system for evaluating the electromagnetic wave absorbability of the noise suppression film.
Figure 4B:
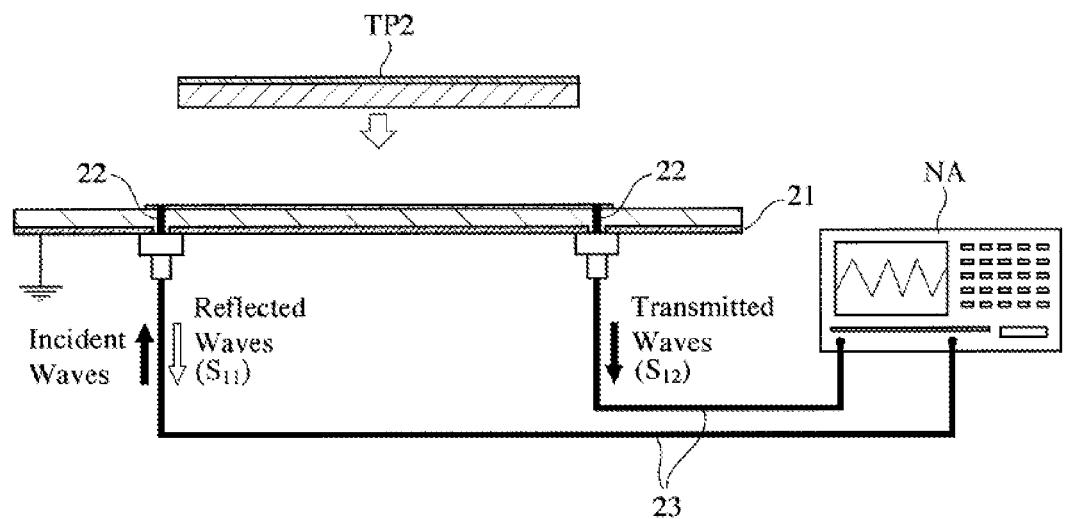
FIG. 4(b) is a partially cross-sectional front view showing a system for evaluating the electromagnetic wave absorbability of the noise suppression film.
Figure 14:
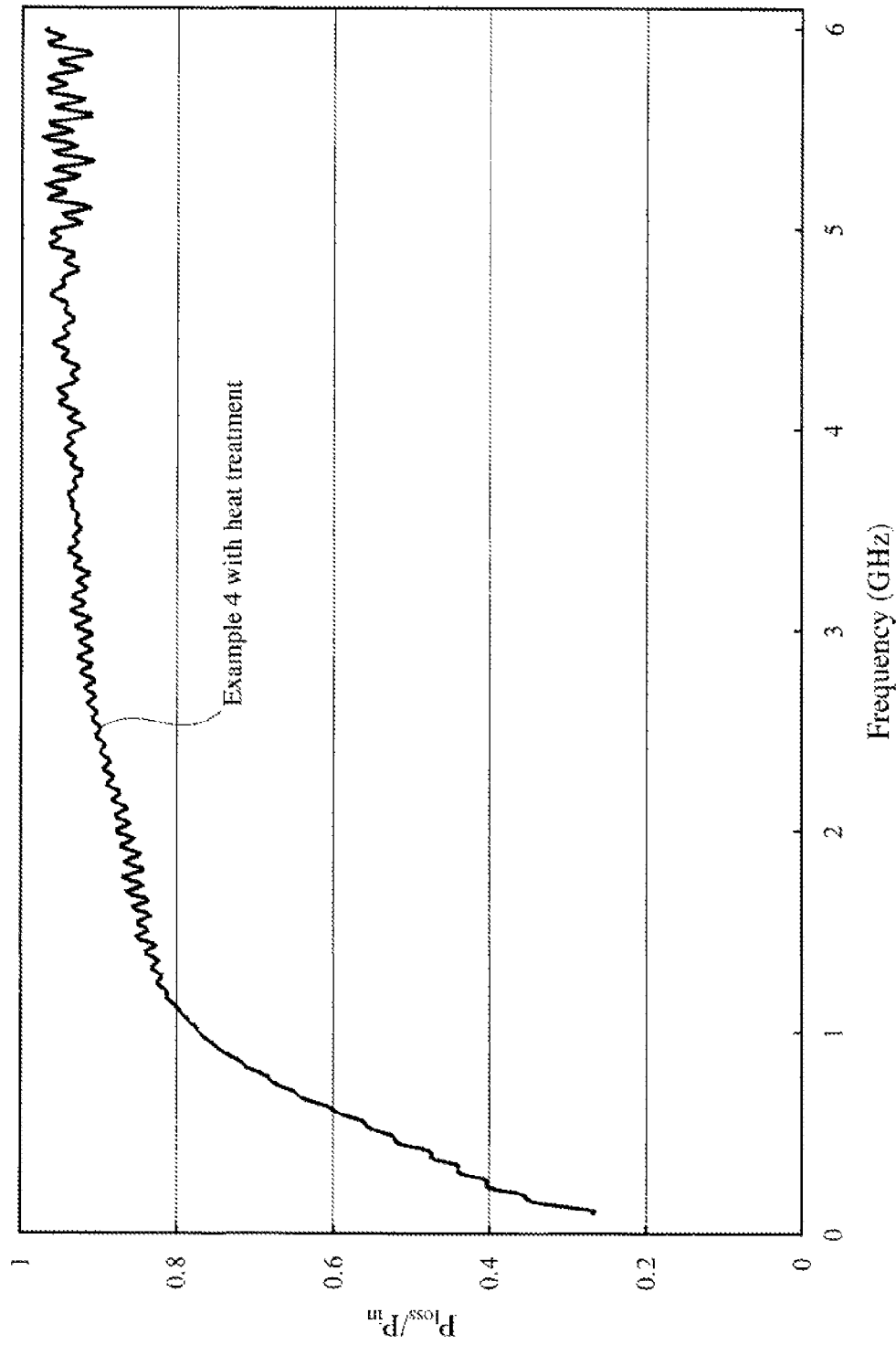
FIG. 14 is a graph showing $P_{loss}/P_{in}$ of the vapor-deposited film sample of Example 4 in a range of 0.1-6 GHz.

With each heat-treated, vapor-deposited film test piece TP2 of Example 4 adhered to a microstripline MSL in the system shown in FIGS. 4(a) and 4(b), the reflective wave power $S_{11}$ and the transmitted wave power $S_{12}$ were measured to determine a noise absorption ratio $P_{loss}/P_{in}$ by the method described in [3](2) above. The results are shown in FIG. 14. As is clear from FIG. 14, the test piece TP2 of Example 4 had a good noise absorption ratio $P_{loss}/P_{in}$ in a frequency range of 0.1-6 GHz.

COMPARATIVE EXAMPLE 5

A long vapor-deposited film was produced in the same manner as in Comparative Example 1, except that the light transmittance target of the thin Ni film 2 at wavelength of 660 nm was 0.3%, and five test pieces TP1 cut out of arbitrary portions thereof were measured with respect to light transmittance and surface resistance by the same methods as in Example 1. The test pieces TP1 had average light transmittance of 0.3% and average surface resistance of 3.8 Ω/square. A sample S of an A4 size (210 mm×297 mm) was cut out of an arbitrary portion of the long vapor-deposited film to measure a transmission attenuation ratio Rtp. The results are shown in FIG. 15.

After a heat treatment at 150° C. for 30 minutes in the same manner as in Example 1, the same sample S was measured with respect to light transmittance and surface resistance by the same methods as in Example 1. The average light transmittance was 0.3%, and the average surface resistance was 3.7 Ω/square. Further, with respect to test pieces TP2 (55.2 mm×4.7 mm) cut out of the heat-treated sample S, the transmission attenuation ratio Rtp was determined in a frequency range of 0.1-6 GHz by the same method as in Example 1. The results are shown in FIG. 15.

Figure 15:
FIG. 15 is a graph showing Rtps of the vapor-deposited film samples of Comparative Example 5 with and without heat treatment in a range of 0.1-6 GHz.

As is clear from FIG. 15, Ni-vapor-deposited films having light transmittance of 0.3% had insufficient transmission attenuation ratios Rtps in a frequency range of 0.1-6 GHz, regardless of the heat treatment.

COMPARATIVE EXAMPLE 6

A long vapor-deposited film was produced in the same manner as in Comparative Example 1, except that the light transmittance target of the thin Ni film 2 at wavelength of 660 nm was 60%, and five test pieces TP1 cut out of arbitrary portions thereof were measured with respect to light transmittance and surface resistance by the same methods as in Example 1. The test pieces TP1 had average light transmittance of 60.5% and average surface resistance of 390 Ω/square.

With respect to 20 test pieces TP2 (55.2 mm×4.7 mm) cut out of arbitrary portions of the long vapor-deposited film, the transmission attenuation ratios Rtps were determined in a frequency range of 0.1-6 GHz by the same method as in Example 1. The maximum and minimum values of transmission attenuation ratios Rtps of 20 test pieces TP2 without heat treatment are shown in FIG. 16.

20 samples S of an A4 size (210 mm×297 mm) were cut out of arbitrary portions of the long vapor-deposited film, and heat-treated at 150° C. for 30 minutes in the same manner as in Example 1. The heat treatment caused heat shrinkage of about 1%. Five test pieces TP1 of 10 cm×10 cm cut out of each heat-treated sample S were measured with respect to light transmittance and surface resistance by the same methods as in Example 1. The heat-treated test pieces TP1 had average light transmittance of 59.0% and average surface resistance of 350 Ω/square.

With respect to test pieces TP2 (55.2 mm×4.7 mm) cut out of 20 heat-treated, vapor-deposited film samples S, the transmission attenuation ratios Rtps were determined in a frequency range of 0.1-6 GHz by the same method as in Example 1. The maximum and minimum values of transmission attenuation ratios Rtps of 20 heat-treated test pieces TP2 are shown in FIG. 16.

Figure 16:
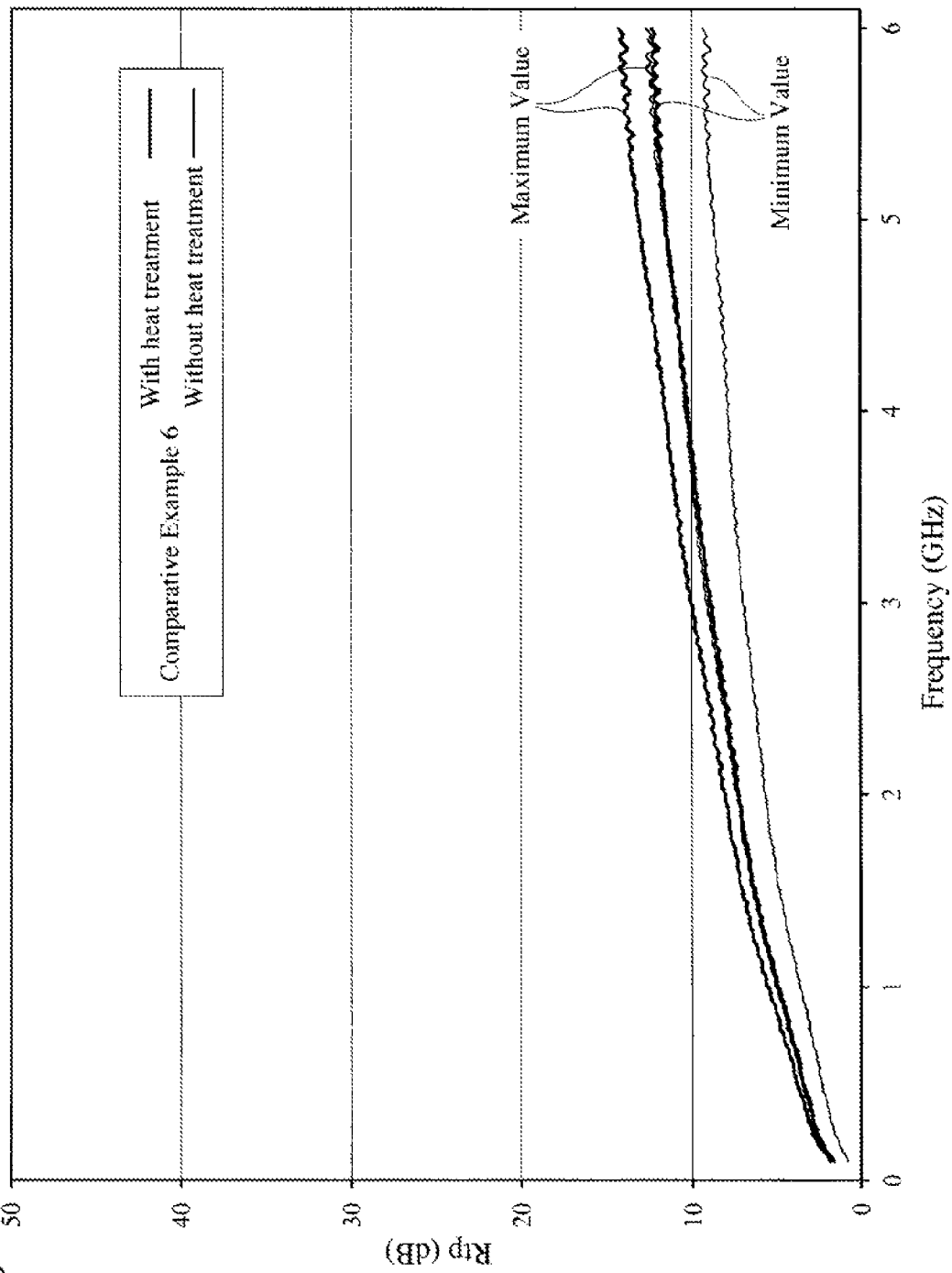
FIG. 16 is a graph showing the maximum and minimum values of Rtps of the vapor-deposited film samples of Comparative Example 6 with and without heat treatment in a range of 0.1-6 GHz.

As is clear from FIG. 16, the Ni-vapor-deposited films having light transmittance of about 60% had insufficient transmission attenuation ratios Rtps in a frequency range of 0.1-6 GHz, regardless of the heat treatment.

With respect to the test pieces of Examples 1-4, which were heat-treated at 150° C. for 30 minutes, and the test pieces of Comparative Examples 1-6, the light transmittance, the surface resistance, the average transmission attenuation ratio Rtp at 6 GHz, and the average noise absorption ratio $P_{loss}/P_{11}$, are shown in Table 1.

TABLE 1

| No. | Heat Treatment | Light Transmittance (%) | Surface Resistance (Ω/square) | Rtp* (dB) | $P_{loss}/P_{in}$* |
|---|---|---|---|---|---|
| Com. Ex. 5 | No | 0.3 | 3.8 | 11.5[1] | 0.75 |
|  | Yes | 0.3 | 3.7 | 9.1[1] | 0.75 |
| Com. Ex. 1 | No | 9.1 | 43 | 27.6 | 0.95 |
| Example 1 | Yes | 8.9 | 39 | 29.3 | 0.93 |
| Com. Ex. 2 | No | 15.5 | 52 | 27.3 | 0.94 |
| Example 2 | Yes | 15.2 | 48 | 30.4 | 0.94 |
| Com. Ex. 3 | No | 27.0 | 107 | 21.8 | 0.96 |
| Example 3 | Yes | 26.5 | 99 | 26.8 | 0.97 |
| Com. Ex. 4 | No | 47.5 | 217 | 17.4 | 0.95 |
| Example 4 | Yes | 46.5 | 185 | 20.2 | 0.96 |
| Com. Ex. 6 | No | 60.5 | 390 | 11.5 | 0.94 |
|  | Yes | 59.0 | 350 | 13.3 | 0.95 |

Note:
*Averaged value.
[1]Measured on one sample.

EXAMPLE 5

Each vapor-deposited film of Comparative Example 2 having light transmittance of 15.5% was heat-treated at each temperature of 80° C., 110° C., 120° C., 150° C., 170° C. and 190° C. for 30 minutes. 20 test pieces TP2 (55.2 mm×4.7 mm) cut out of arbitrary portions of each long vapor-deposited film were measured with respect to the transmission attenuation ratio Rtp by the same method as in Example 1. The range and average value of the transmission attenuation ratios Rtps of test pieces obtained at each heat treatment temperature are shown in Table 2.

TABLE 2

| Heat Treatment Temperature (° C.) | Rtp (dB) Range | Rtp (dB) Average |
|---|---|---|
| 80 | —[1] | —[1] |
| 110 | 28-29 | 28.3 |
| 120 | 28-30 | 29.2 |
| 150 | 30-31 | 30.4 |
| 170 | 30-31 | 30.6 |
| 190 | —[2] | —[2] |

Note:
[1]There was substantially no change in Rtp by the heat treatment.
[2]Measurement could not be conducted by the deformation of the PET film.

As is clear from Table 2, the noise suppression films obtained at heat treatment temperatures of 110-170° C. had large transmission attenuation ratios Rtps with narrow ranges (small unevenness). On the other hand, the heat treatment temperature of 80° C. had an insufficient effect of improving the transmission attenuation ratio Rtp, and the heat treatment temperature of 190° C., higher than 180° C., reduced the transmission attenuation ratio Rtp, and made films of usual resins such as PET unusable.

EFFECTS OF THE INVENTION

Because the noise suppression film of the present invention is obtained by heat-treating a vapor-deposited thin Ni film, it has not only high absorbability of electromagnetic wave noises of several hundred MHz to several GHz, but also stable surface resistance substantially free from change with time, suffering no change with time of electromagnetic wave absorbability. The noise suppression film of the present invention having such features is effective for absorbing near-field electromagnetic wave noises of several hundred MHz to several GHz in various mobile communications terminals such as mobile phones and smartphones, and electronic appliances such as personal computers, etc.

What is claimed is:

1. A method for producing a noise suppression film having reduced unevenness of electromagnetic wave noise absorbability, which comprises the steps of:
    vapor-depositing a Ni film on one surface of a stretched plastic film of polyethylene terephthalate having thickness of 10-30 μm, so that the Ni film contacts on the surface of stretched plastic film of polyethylene terephthalate; and
    heat-treating said Ni film on said stretched plastic film at a temperature in a range of 110-170° C. for 10 minutes to 1 hour to cause such a heat shrinkage of said stretched plastic film that (a) a light transmittance of said Ni film measured with laser rays having a wavelength of 660 nm is 3-45%, and that (b) the surface resistance of said Ni film is 10-200 Ω/square when measured as a square test piece TP of 10 cm×10 cm under a load of 3.85 kg applied via a flat pressure plate, with a pair of electrodes each having a length completely covering a side of said test piece disposed on opposing side portions of said test piece.

2. The method for producing a noise suppression film according to claim 1, wherein the heat treatment temperature of said Ni film is 130-160° C.

3. The method for producing a noise suppression film according to claim 1, wherein the heat treatment time of said Ni film is 20-40 minutes.

4. The method for producing a noise suppression film according to claim 1, wherein a protective film is laminated on said Ni film.

5. The method for producing a noise suppression film according to claim 1, wherein the light transmittance of said Ni film is 5-45%.

6. The method for producing a noise suppression film according to claim 1, wherein the light transmittance of said Ni film is 8-30%.

* * * * *